United States Patent [19]

Turner et al.

[11] Patent Number: 4,663,268
[45] Date of Patent: May 5, 1987

[54] HIGH-TEMPERATURE RESISTANT PHOTORESISTS FEATURING MALEIMIDE BINDERS

[75] Inventors: Sam R. Turner, Pittsford; Conrad G. Houle, Webster, both of N.Y.

[73] Assignee: Eastman Kodak Company, Rochester, N.Y.

[21] Appl. No.: 831,951

[22] Filed: Feb. 24, 1986

Related U.S. Application Data

[63] Continuation-in-part of Ser. No. 687,306, Dec. 28, 1984, abandoned.

[51] Int. Cl.$^4$ .................... G03C 1/495; G03C 1/52; G03F 7/26
[52] U.S. Cl. .................... 430/270; 430/190; 430/192; 430/326; 430/325; 522/166
[58] Field of Search ............... 430/325, 270, 326, 190, 430/192; 522/166

[56] References Cited

U.S. PATENT DOCUMENTS

| 3,265,708 | 8/1966 | Stiteler | 260/326.5 |
| 3,622,321 | 11/1971 | Smets et al. | 430/270 |
| 3,964,908 | 6/1976 | Bargon et al. | 430/326 |
| 4,196,003 | 4/1980 | Watanabe | 430/193 |
| 4,339,521 | 7/1982 | Ahne et al. | 430/192 |
| 4,415,652 | 11/1983 | Proskow | 430/326 X |
| 4,439,516 | 3/1984 | Cermigliaro et al. | 430/192 |
| 4,524,121 | 6/1985 | Gleim et al. | 430/270 |

FOREIGN PATENT DOCUMENTS

| 1997 | 2/1981 | European Pat. Off. . |
| 48214 | 8/1981 | European Pat. Off. . |
| 113314 | 7/1984 | European Pat. Off. . |
| 1512972 | 6/1978 | United Kingdom . |

OTHER PUBLICATIONS

Bruce E. Babb et al., "Stable Photosensitive Triorganophosphine Aromatic Azide Complexes", No. 13459, *Research Disclosure*, Jun. 1975, pp. 51-53.

*Primary Examiner*—John E. Kittle
*Assistant Examiner*—Cynthia Hamilton
*Attorney, Agent, or Firm*—Dana M. Schmidt

[57] ABSTRACT

There is disclosed a resist comprising a radiation-sensitive sensitizer that produces, with a binder, imagewise differential solubility when imagewise exposed. The resist is improved in that the binder has a rigid heterocyclic ring structure with the formula

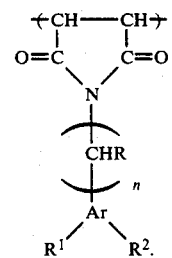

8 Claims, No Drawings

HIGH-TEMPERATURE RESISTANT PHOTORESISTS FEATURING MALEIMIDE BINDERS

RELATED APPLICATIONS

This application is a continuation-in-part application of U.S. Ser. No. 687,306 entitled "High-Temperature Resistant, Selectively Developable Positive-Working Resist", filed on Dec. 28, 1984, now abandoned.

FIELD OF THE INVENTION

This invention relates to radiation-sensitive photoresists and binders for the same.

BACKGROUND OF THE INVENTION

One of the greatest demands for improvement in integrated circuit photoresists is in the area of thermal resistance. The reason is that post-baking of resists, after development, at temperatures of 250° C. for up to 30 minutes, is commonly required in order to remove residual solvents in preparation for low vacuum ion implantation. Furthermore, the process of ion implantation itself often involves high temperature build-up. Present commercial resists, and particularly positive-working resists, tend to lack such thermal resistance. For example, positive-working resists comprising light-sensitive quinone-diazide sensitizer compounds in novolac resin binders suffer a loss of image integrity especially in the wall angles. That is, their image profiles tend to "slump" and they lose their line width control. This lack of resistance to heating occurs in spite of the presence of a recurring rigid ring structure (the phenylene group) as part of the polymer backbone in the novolac resin. Such rigid ring structures had been thought to contribute thermal resistance.

Resists have been described in the prior art literature wherein various synthetic polymers have been blended "to increase the strength" of the images. For example, styrene-maleic anhydride copolymers have been added to conventional light-sensitive layers, as described for example in U.S. Pat. No. 4,196,003, issued on 4/1/80. However, such a copolymer has been found to cause very slow development times which are unacceptable for practical use. A more active solvent will wash away the desired areas more rapidly but often at the expense of the areas that are intended to remain. Proper developer selectivity provides that development will occur in 30 sec, and that the loss after 30 sec of development in the remaining resist portions (which in the positive resist are unexposed), will be no more than 10%.

Still other polymers have been created with rigid ring structures as part of the backbone, but these polymers have not been as desirable as binders because they lack sufficient aqueous-base solubility when combined with the decomposition products of the exposed sensitizer.

Therefore, there has been a need prior to this invention for an aqueous base solvent-developable binder for photoresists that will withstand, after development, high temperature processing at 250° C. with substantially no significant change or distortion in image profiles, and still provide a practical development time as discussed above.

SUMMARY OF THE INVENTION

The present invention features a photoresist comprising a binder with enhanced high-temperature resistance and developer selectivity. That is, it is an advantageous feature of the invention that an aqueous-developable photoresist is provided which, after sufficiently selective development, is processable up to temperatures as high as 250° C. without any significant change in the image profile.

This feature, and others that will be evident from the description which follows, are achieved, more specifically, by a photoresist comprising a sensitizer compound and a binder effective to produce imagewise differential solubility, upon imagewise exposure to activating radiation, in the presence of a selected aqueous base solvent. The photoresist is improved in that the binder comprises a polymer having recurring units with the structural formula

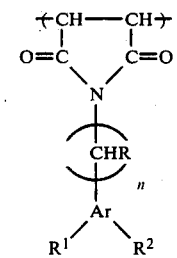

wherein Ar is aryl of from 6 to 10 carbon ring atoms, R is hydrogen or alkyl of 1 to 5 carbon atoms, or aryl of 6 to 10 carbon atoms, $R^1$ and $R^2$ are individually H, —OH, —COOH or

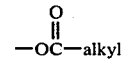

wherein alkyl contains from 1 to 5 carbon atoms, and n is an integer of from 0 to 3.

As used herein, "differential solubility" refers to, in the positive-working embodiment, the exposed portions of the photoresist being more soluble in the developer that the unexposed-portions. In the negative-working embodiment, it is the reverse.

DESCRIPTION OF THE PREFERRED EMBODIMENTS

The binder of this invention is described primarily in connection with an aqueous developable photoresist wherein this binder is blended with a novolac resin and exposure is to a UV source. In addition, the invention is useful when the binder herein described is the sole binder for the resist, that is, the sole polymer that is relatively insensitive to the activating radiation. It is further useful when the activating radiation is other than a UV source.

As is conventional, the photoresist of the invention comprises, in addition to the binders, a compound, hereinafter called the "sensitizer", that is sensitive to the activating radiation to produce either one of two conditions:

(a) it produces decomposition products, if it is positive-working, that are more soluble in a selected developer solvent than the original sensitizer, or (b) it produces an activated moiety that increases the molecular weight or causes crosslinking of the binder, so as to be negative-working. Any such sensitizer can be used.

In the case of the positive-working embodiments, quinone diazide compounds are particularly useful (for example,

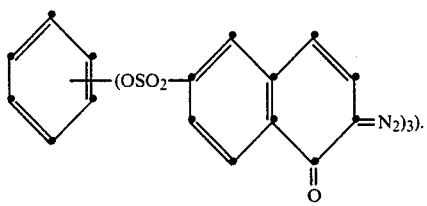

In the case of the negative-working embodiments, the sensitizer can be any chemical which, when exposed to activating radiation, forms an activated form that causes cross-linking of the binder. Preferred examples include mono- and bis-azides, for example, azides described in *SPIE, Advances in Resist Technology,* Vol. 539 (1985), pages 189–192, such as 4-t-butyl-2,5-bis(p-azidobenzal)-cyclohexanone. (The details of the aforesaid SPIE article are hereby expressly incorporated by reference.) Suitable developer solvents for the decomposition products of such sensitizers include aqueous bases such as 1% by weight NaOH, 2.5% tetramethylammonium hydroxide, and methyltriethanolammonium hydroxide.

We have discovered that the improved aqueous developer selectivity is achievable with improved high temperature resistance by using the binder of this invention. This binder has a rigid heterocyclic ring structure, a portion of which comprises the backbone of the polymer in a recurring unit thereof.

Preferably, the polymer comprising the binder of the resist of this invention has a recurring unit wherein a nitrogen-containing ring comprises part of the backbone of the polymer. Most preferably, the nitrogen atom is not in the direct backbone, but is pendant. More particularly, the most preferred examples are maleimide polymers, such as those having recurring units with the structural formula

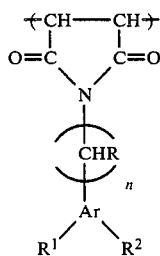

wherein Ar is substituted or unsubstituted aryl of from 6 to 10 carbon ring atoms, R is hydrogen or alkyl of 1 to 5 carbon atoms, or aryl of 6 to 10 carbon atoms, substituents $R^1$ and $R^2$ are individually H, —OH, —COOH or

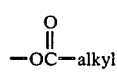

wherein alkyl contains from 1 to 5 carbon atoms, and n is an integer of from 0 to 3. Useful examples of Ar as an unsubstituted 6 to 10 carbon ring are phenyl and naphthyl. Useful examples of R include hydrogen, methyl, and phenyl. Useful examples of the alkyl portion of $R^1$ and $R^2$ include methyl, ethyl, propyl, butyl, and pentyl.

Particularly preferred are the above-noted maleimide polymers when such polymers are copolymerized to have as additional recurring units, those having the structural formula

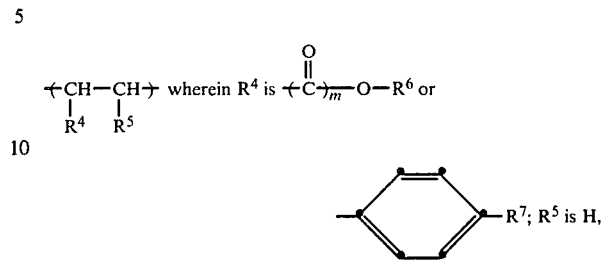

alkyl of from 1 to 10 carbon atoms, such as methyl, ethyl, propyl, hexyl, and the like; or aryl of 6 to 10 ring atoms, e.g., phenyl; or together $R^4$ and $R^5$ form a fused naphthalene; $R^6$ is alkyl of 1 to 5 carbon atoms, for example, methyl, ethyl, propyl, butyl and pentyl; $R^7$ is hydrogen, —Si($R^6$)$_3$, —OH or $$-O-\overset{O}{\underset{\|}{C}}-R^6;$$

and m is 0 or 1.

Of the aforedescribed copolymers, particularly preferred are those that provide a water-solubilizing group such as hydroxy, on at least one of the recurring units.

Thus, particularly useful binders for the photoresist include poly[N-(p-hydroxyphenyl)maleimide-co-styrene]; poly[N-(p-hydroxyphenyl)maleimide-co-ethyl acrylate]; poly(N-phenylmaleimide-co-p-hydroxystyrene), and poly[N-(p-hydroxyphenyl) maleimide-co-stilbene].

If the described polymer is the sole binder of the resist, particularly preferred comonomers polymerized together with the maleimide comonomer include, individually, trimethylsilyl-substituted styrene, ethyl acrylate, stilbene, and n-butyl vinyl ether.

The molecular weight of the binder of the invention is believed to be not critical. However, the preferred maleimide copolymers are those which, when used as a blend with other binders, have a $\overline{Mw}$ between about 5,000 and 250,000 as determined by size exclusion chromatography. $\overline{Mw}$ values larger than this slow down the developability rate. If the binder of the invention is the sole binder of the resist, then preferably the $\overline{Mw}$ is between about 10,000 and about $1 \times 10^6$.

In the event the binder of the invention is a maleimide copolymer, the mole ratio of the maleimide recurring unit is not critical. Preferably, it comprises from about 10 mole % to about 95 mole %. More preferably, it is between about 30 and 80 mole %. A highly preferred embodiment is one in which the mole ratio is 50%, to produce an alternating copolymer.

It is further contemplated that other useful polymeric binders of the invention comprise those in which a recurring unit has the structural formula $$\begin{array}{c}
+\text{CH}\text{———}\text{CH}\!\!\rightarrow \\
| \qquad\qquad | \\
\text{O}=\text{C} \qquad \text{C}=\text{O} \\
\diagdown \quad \diagup \\
\text{N}-\text{N} \\
| \qquad | \\
R^8 \quad R^9
\end{array}$$

wherein $R^8$ and $R^9$ are individually hydrogen or

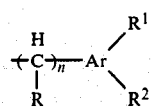

with Ar, R, $R^1$, $R^2$, and n as defined above. Such polymers are prepared by reacting the maleic anhydride with a substituted hydrazine.

The process for preparing the polymeric binders of the invention is conventional. The following preps are illustrative of such conventional processes:

Preparation 1. Preparation of Poly[styrene-alt-N-(p-acetoxyphenyl)maleimide]*

A polymerization bottle was charged with 6.0 g (0.0258 mol) of the maleimide and 2.70 g (0.0258 mol) freshly distilled styrene. 2,2'-Azobis(2-methylpropionitrile) (AIBN) (0.06 g) was added followed by 50 ml of acetone. The bottle and contents were sparged with Argon for one minute and then the bottle was sealed. The bottle was placed into a 60° C. oil bath for a time of 28 hrs. A very viscous solution was obtained with the copolymer obtained by precipitation from methanol. The copolymer was dried under vacuum at 50° C. for 48 hrs. A yield of 8.3 g (78%) was obtained. GPC analyses in tetrahydrofuran (THF) gave $\overline{Mw}$ 244,600, $\overline{Mn}=66,800$ and $\overline{Mw}/\overline{Mn}=3.66$. Analysis Calcd. for $C_{20}H_{17}NO_4$ (1:1 structure): C, 71.6; H, 5.1; N, 4.2. Found: C, 70.9; H, 5.1; N, 4.4.

*The term "alt" in the name is indicative that the polymer is formed by the comonomers alternating in the chain.

Preparation 2. Preparation of Poly[styrene-alt-N-(p-hydroxyphenyl)maleimide]

This process is illustrative of a standard technique to obtain the phenolic form of the copolymer.

A 500 ml round-bottomed flask was charged with 300 ml acetone and 7.0 g of the copolymer of Preparation 1. After the polymer was in solution a mixture of 30 ml of methanol and 50 ml of acetone were added along with 1.2 g of p-toluenesulfonic acid. The acetone along with the methyl acetate formed were slowly distilled off until a volume of about 50 ml remained in the flask. This viscous solution was dropped into methanol to yield a white solid. About 6.0 g (98%) polymer was obtained. This was dried for about 48 hrs at 40°–50° C. in a vacuum oven. The ir spectrum showed a strong —OH bond at 3450 cm$^{-1}$ which was not present in the starting copolymer. Analyses Calcd. for $C_{18}H_{15}NO_3$: C, 73.7; H, 5.2; N, 4.8. Found: C, 71.4; H, 5.1; N, 4.7. Tg=242° C.

Several other copolymers were prepared in a similar fashion and are listed in Table I.

The glass transition temperatures of these copolymers were determined by differential scanning calorimetry and are listed in Table I.

TABLE I—COPOLYMERS PREPARED

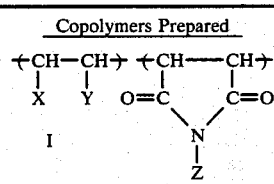

| Prep. No. | X | Y | Z | $\overline{Mw}$ | $\overline{Mn}$ | $\overline{Mw}/\overline{Mn}$ | Tg °C. |
|---|---|---|---|---|---|---|---|
| 3 | H | ⌬—OC(O)—CH₃ | ⌬—OC(O)—CH₃ | 235,000 | 66,700 | 3.52 | 225 |
| 4 | H | ⌬—OH | ⌬—OH | — | — | — | 258 |
| 5 | ⌬ | ⌬—OC(O)—CH₃ | ⌬—OC(O)—CH₃ | 69,000 | 26,400 | 2.61 | — |
| 6 | H | ⌬—OC(O)—CH₃ | ⌬—H | — | — | — | — |
| 7 | X + Y = naphthyl | | ⌬—OC(O)—CH₃ | 26,500 | 17,100 | 1.54 | 201 |

TABLE I-continued

Copolymers Prepared $$\mathrm{-(CH-CH)-(CH-CH)-}$$
$$\mathrm{\quad |\quad |\quad \quad |\quad \quad |}$$
$$\mathrm{\quad X\quad Y\quad O=C\quad C=O}$$
$$\mathrm{\quad\quad\quad\quad\quad\backslash N/}$$
$$\mathrm{\quad\quad\quad\quad\quad\quad |}$$
$$\mathrm{\quad\quad\quad\quad\quad\quad Z}$$

Structure I

| Prep. No. | X | Y | Z | $\overline{Mw}$ | $\overline{Mn}$ | $\overline{Mw}/\overline{Mn}$ | Tg °C. |
|---|---|---|---|---|---|---|---|
| 8 | H | —⟨phenyl⟩— | —⟨phenyl⟩—OC(=O)—CH$_3$ | 244,600 | 66,800 | 3.66 | 224 |
| 9 | H | —C(=O)—OCH$_2$CH$_3$ | —⟨phenyl⟩—OH | 5,200 | 12,900 |  | 196 |

The preparation of a copolymer of trimethylsilyl-substituted styrene and (p-hydroxyphenyl)maleimide is similar to the above.

Preparation No. 10—Preparation of Poly[stilbene-alt-N-(p-acetoxyphenyl)maleimide]

The following preparative example illustrates the use of dodecylthiol as a chain transfer agent to insure that low molecular weights result from the preparation of binders of this invention.

A one-liter three-necked flask was charged with 46.8 g stilbene (0.26 mol), 600 g of N-p-acetoxyphenyl maleimide (0.26 mol), 500 ml of 2-butanone, 0.4 g of 2,2'-azobis(2-methylpropionitrile) and 2.5 g of dodecylthiol as a chain transfer agent. The reaction mixture was purged with nitrogen gas for 2 minutes and then heated under a nitrogen atmosphere for a 24-hour polymerization period at 60° C. The homogeneous reaction mixture was slowly stirred over 24 hours. The product was precipitated into methanol and vacuum dried at 50° C. to yield 86.0 g of a white powder. The copolymer was characterized as having $\overline{Mn}=9,700$, $\overline{Mw}=14,400$ and $\overline{Mw}/\overline{Mn}=1.48$ (by GPC analyses.)

Preparation No. 11—Preparation of Poly[n-butyl vinyl ether-alt-N-(p-hydroxyphenyl)maleimide]

The preparation of Poly[n-butyl vinyl ether-alt-N-(p-hydroxyphenyl)maleimide] was done in a fashion similar to Preparations 1-9.

It will be appreciated that the resist is prepared by admixing the binder of the inventiion in an appropriate coating solvent, along with the sensitizer and optional addenda such as dyes, pigments, surfactants, plasticizers, stabilizers and the like, all of which are conventional. Also, additional polymeric binders can be added, for example, novolac resins. Particularly preferred are those resists wherein up to 90 weight % of the binder is a novolac resin. For example, any of the novolac resins described in U.S. Pat. No. 4,294,911 is useful, and particularly those that are esterified cresol-formaldehyde and phenol-formaldehyde resins capped with a quinone diazide and having a weight-average molecular weight of between about 1000 and about 15,000. Such capped novolac resins generally have the structural formula

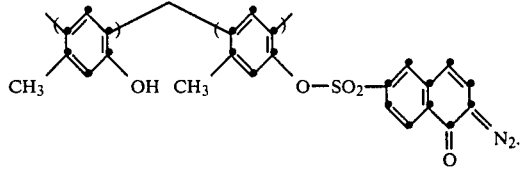

The manner of preparing the resist composition and coating it onto a substrate or support, and of exposing and developing such a coated composition, are conventional steps which require no further elaboration. Any conventional substrate or support is useful, and illustrative examples appear in the aforesaid U.S. Pat. No. 4,294,911.

EXAMPLES

The following examples further illustrate the invention.

EXAMPLE 1

Positive-Working Embodiment

The following were mixed to form a resist formulation:
1.8 g novolac—(wherein 3 mole % of the hydroxyl groups are capped with the quinone diazide)
0.4 g phloroglucinol-triquinone diazide**
0.4 g poly[p-hydroxystyrene-alt-N-(p-hydroxyphenyl)-maleimide]
5.6 g cyclopentanone

**This is a mixture of phloroglucinol esterified with one, two, and three quinone diazide groups, i.e., a mixture of

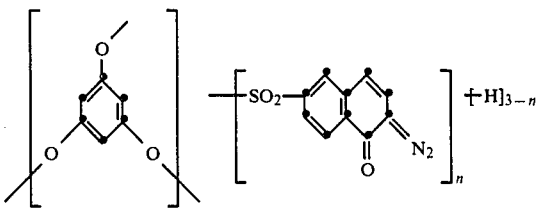

where N=1 to 3.

The resist formulation was spin-coated at 5000 rpm on SiO$_2$ wafers, prebaked at 90° C. for 30 minutes, exposed for 12 sec to a UV source and developed in 1% NaOH solution. The thickness loss due to development (for 10 sec) was 1.5%. For 30-sec development, such loss is expected to be less than 8%. The imaged wafers were baked at 200° C. for 30 minutes. Scanning electron micrographs (SEMs) showed no significant change in image profiles. As used herein, "significant change" and "significant distortion" mean, that the slope of the image wall does not become less than 70°, no change occurs in the base dimension, and no significant rounding occurs at the top of the image.

EXAMPLE 2

Poly[trans-stilbene-alt-N-(p-hydroxyphenyl)maleimide] as the Binder In a Positive-Working Resist The following were mixed to form a resist formulation:
2.7 g novolac—3 mole % quinone diazide
0.6 g phloroglucinol triquinone diazide
0.6 g poly[trans-stilbene-alt-N-(p-hydroxyphenyl)maleimide], which is Preparation No. 10 as modified by the procedure of Preparation No. 2.
8.64 g 2-ethoxyethyl acetate
0.96 g 4-butyrolactone The resist was coated at 5000 rpm on SiO$_2$ wafers, prebaked at 95° C. for 30 minutes, exposed for 14 sec to a 200 W UV source and developed for 15 sec using Kodak KPD Developer diluted 1:1 with water. The thickness loss due to development was 5.4%. The imaged wafers were baked at 250° C. for 30 minutes. SEMs showed no significant change in image profile.

EXAMPLE 3

Poly[styrene-alt-N-(p-hydroxyphenyl)maleimide] as the Binder In a Positive-Working Resist The following resist composition was prepared, spin-coated at 7000 rmp on a SiO$_2$ wafer, prebaked at 90° C. for 30 minutes, exposed to a 200 W UV source for 14 seconds, and developed in 2.86% tetramethylammonium hydroxide for 32 seconds. The thickness loss was 6.0%. Scanning electron micrographs showed no significant changes in image profile after post-baking to 250° C. for 30 minutes.

Composition 2.5 g novolac—3 mole percent quinone diazide
0.54 g phloroglucinol triquinone diazide
0.54 g poly[styrene-alt-N-(p-hydroxyphenyl)maleimide]
6.75 g 2-ethoxyethyl acetate
0.75 g 4-butyrolactone

EXAMPLE 4

Use of Preparation No. 9 In a Positive-Working Resist

A resist formulation was prepared as described in Example 3 except using 0.54 g of poly[ethyl acrylate-alt-N-(p-hydroxyphenyl)maleimide] in place of the styrene copolymer binder. The formulation was spin-coated at 8000 rpm on a SiO$_2$ wafer, prebaked at 90° C. for 30 minutes, exposed to a 200 W UV source for 14 seconds, and developed in 2.86% tetramethylammonium hydroxide for 28 seconds. The thickness loss was 7.6%. Scanning electron micrographs showed no significant changes in image profile after post-baking to 250° C. for 30 minutes.

EXAMPLE 5

Use of Preparation No. 11 In a Positive-Working Resist

A resist element was prepared as described in Example 4 except (1) the binder polymer used was poly[n-butyl vinyl ether-alt-N-(p-hydroxyphenyl)maleimide], (2) the coating speed was 8500 rpm, and (3) the development time was 26 seconds. The thickness loss was 5.0% and SEMs showed no significant changes in image profile after post-baking to 250° C. for 30 minutes.

COMPARTIVE EXAMPLES 1 AND 2

The procedure of Examples 1 and 2 was repeated, except that KMPR 820, a commercial novolac quinone diazide resist formulation without any high Tg thermally enhancing polymer added, was used as the resist. In both cases this resist showed severe rounding of images under identical 200° C. baking conditions.

EXAMPLE 6

Sole Binder Example In a Positive-Working Resist

The following were mixed to form a resist formulation:
3.0 g poly[p-(trimethylsilyl)styrene-alt-N-(p-hydroxyphenyl)maleimide]
0.3 g phloroglucinol-triquinone diazide
35 g cyclohexanone The resist formulation was spin coated at 2000 rpm on SiO$_2$ wafers, prebaked at 90° C. for 30 minutes and exposed for 10 seconds with a UV source. Wafers were developed with 5% tetramethylammonium hydroxide. High resolution images with good cleanout were noted.

EXAMPLE 7

A Negative-Working Embodiment

A resist formulation was prepared using 3.0 g. of poly[styrene-co-N-(p-hydroxyphenyl)maleimide] (Mw of 26,000) and 0.45 g. of 4-t-butyl-2,5-bis(p-azidobenzal)cyclohexanone dissolved in 18 ml of cyclopentanone. This solution was filtered and then spin coated at 2000 rpm on a SiO2 wafer. After prebaking for 30 min at 90° C. this wafer was exposed in the contact mode to a broad band uv light source for 15 seconds. High resolution negative images were obtained by developing in 0.5% tetramethylammonium hydroxide solution. Scanning electron micrographs showed no image change when these images were post-baked to 200° C. for 30 minutes.

The invention has been described in detail with particular reference to preferred embodiments thereof, but it will be understood that variations and modifications can be effected within the spirit and scope of the invention.

What is claimed is:

1. In a photoresist comprising a sensitizer compound and a binder effective to produce imagewise differential solubility, upon imagewise exposure to acivating radiation, in the presence of a selected aqueous base solvent, the improvement wherein said binder comprises a polymer having recurring units with the structural formula

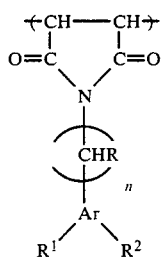

wherein Ar is aryl of from 6 to 10 carbon ring atoms, R is hydrogen or alkyl of 1 to 5 carbon atoms, or aryl of 6 to 10 carbon atoms, $R^1$ and $R^2$ are individually H, —OH, —COOH or

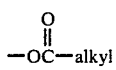

wherein alkyl contains from 1 to 5 carbon atoms, and n is an integer of from 0 to 3.

2. A photoresist as defined in claim 1, wherein said polymer is a copolymer that further includes recurring units having the structure

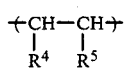

wherein
$R^4$ is

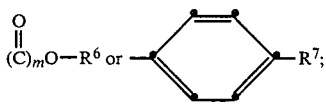

$R^5$ is H, alkyl of from 1 to 10 carbon atoms, or aryl of from 6 to 10 ring atoms, or together $R^4$ and $R^5$ form a fused naphthalene,
$R^6$ is alkyl of 1 to 5 carbon atoms,
$R^7$ is hydrogen,

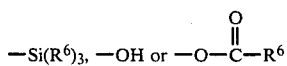

and m is 0 or 1.

3. A photoresist as defined in claim 1, wherein said polymer is the sole binder for said photoresist.

4. In a photoresist comprising a sensitizer compound and a binder effective to produce imagewise differential solubility, upon imagewise exposure to activating radiation, in the presence of a selected aqueous base solvent, the improvement wherein said binder comprises a polymer having recurring units with the structural formula

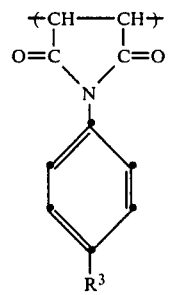

wherein $R^3$ is H or OH.

5. A photoresist as defined in claim 4, wherein said polymer is a copolymer that further includes recurring units having the structure

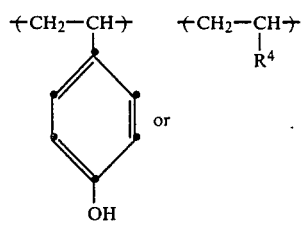

wherein
$R^4$ is

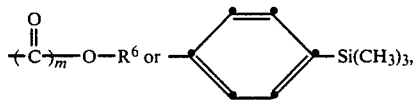

$R^6$ is alkyl of 1 to 5 carbon atoms and
m is 0 or 1.

6. A photoresist as defined in claim 5, wherein said polymer is the sole binder for said photoresist.

7. A photoresist as defined in claim 1, wherein said sensitizer compound is positive-working.

8. A photoresist as defined in claim 1, wherein said sensitzer compound is negative-working.

* * * * *